United States Patent [19]

Yamaguchi et al.

[11] Patent Number: 5,751,822
[45] Date of Patent: May 12, 1998

[54] AMBIENT NOISE SUPPRESSION CIRCUIT

[75] Inventors: Noboru Yamaguchi, Yokohama; Masao Konomi, Tokyo, both of Japan

[73] Assignee: Pan Communications, Inc., Tokyo, Japan

[21] Appl. No.: 229,087

[22] Filed: Apr. 18, 1994

[30] Foreign Application Priority Data

Jan. 18, 1994 [JP] Japan ................... 6-016920

[51] Int. Cl.⁶ .................. H04R 1/00; H03G 5/00; H03G 9/00; H03G 3/00
[52] U.S. Cl. .................. 381/94.1; 381/71.1; 381/94.5
[58] Field of Search ................. 455/79, 89, 115, 455/116, 221, 218; 379/390; 381/92, 94, 107, 108, 110

[56] References Cited

U.S. PATENT DOCUMENTS

| 4,112,384 | 9/1978 | Buchberger | 381/107 |
| 4,506,381 | 3/1985 | Ono | 381/94 |
| 4,771,472 | 9/1988 | Williams, III et al. | 381/107 |
| 5,036,540 | 7/1991 | Eastmond | 381/47 |
| 5,212,551 | 5/1993 | Conanan | 358/143 |
| 5,235,637 | 8/1993 | Kraz et al. | 379/387 |
| 5,371,803 | 12/1994 | Williamson, III | 381/104 |
| 5,461,223 | 10/1995 | Butturini | 235/462 |

FOREIGN PATENT DOCUMENTS

| 0311808A3 | 4/1989 | European Pat. Off. | H04R 3/00 |
| 0380290 | 8/1990 | European Pat. Off. | H04M 1/60 |
| 2616607 | 6/1987 | France | H04M 1/58 |
| 4-7141 | 4/1984 | Japan | H04M 1/19 |
| 59-75744 | 4/1984 | Japan | H04M 1/19 |
| 2221121 | 1/1990 | United Kingdom | H04R 3/04 |

OTHER PUBLICATIONS

Exhibit A.

*Primary Examiner*—Thomas D. Lee
*Assistant Examiner*—Jerome Grant, II
*Attorney, Agent, or Firm*—Finnegan, Henderson, Farabow, Garrett & Dunner, L.L.P.

[57] ABSTRACT

An ambient noise suppression electrical circuit to be used with a voice communication terminal comprising a gain control amplifier, whose input is a microphone, and a peak-hold circuit that includes a band-pass amplifier that amplifies a specified frequency range of the output signals of the microphone, a peak detection circuit that produces signals in proportion to the peak level of the output signals of the band-pass amplifier, and a holding circuit that controls reduction of output signals of the peak detection circuit for a specified period of time. The output signal from the peak-hold circuit controls the gain of the gain control amplifier. When a microphone is located far from a mouth and is used under high ambient noise, the present invention makes it possible for the microphone to perform as if it is a microphone which is located in a quality telephone handset that cuts off ambient noise.

7 Claims, 7 Drawing Sheets

FREQUENCY (KHz)

2

AMBIENT NOISE SUPPRESSION CIRCUIT

BACKGROUND OF THE INVENTION

The present invention relates to an ambient noise suppression electrical circuit to be used with such voice communication terminals as telephones in general. The circuit works well in particular with a transmitter (or a microphone) located far from the mouth of its user with a feature of not using a hand to operate the terminal (a "hands-free" terminal). The transmitter located far from the mouth tends to pick up more ambient noise than a conventional telephone handset. The reason for such prominence of ambient noise is that the voice level reaching the transmitter of the hands-free terminal is lower than the voice level reaching a conventional handset that has a transmitter located less than 2 cm. away from the mouth, while ambient noise levels picked up by both terminals remain the same.

For existing handset telephones, the average distance between transmitter (microphone) and the mouth is approximately 2 cm. Such distance rarely reaches more than 4 to 5 cm. When the ambient noise is fairly high, the transmitter of an ordinary handset is unconsciously brought closer to the mouth. As a result, people are usually not very conscious of noise when receiving a call.

Recent developments in miniaturization and wireless technologies have brought rise to a remarkable development of wireless and mobile telephones. Hands-free telephones, with which users are able to make calls while driving a car, going for a walk, doing office work, and doing other things without using their hands, have become a product society now needs most.

There are several hands-free telephone terminals currently in the market or being suggested in patent filings, some of which are shown in FIGS. 8 to 12. The structure of each terminal is explained as follows:

Within FIGS. 8 to 12, A designates the speaker and B designates the microphone. In FIGS. 8 to 10 speaker A is separated by an extended distance from microphone B which is located relatively close to the mouth. The distance from mouth to microphone is approximately 4 to 5 cm. However, in FIGS. 11 and 12, speaker A and microphone B are mounted together within one earpiece case to be installed in an ear (an earpiece telephone). The microphone has a distance of greater than 10 cm to the mouth.

The earpiece telephones, because they are installed in the ear (unlike the other hands-free models of FIGS. 8 to 10), contain speaker A and microphone B in close proximity to each other. This close proximity of speaker A and microphone B, however, causes feedback to be easily generated. In order to avoid this feedback, microphone sensitivity has to be lowered. Because of this structure, ambient noise becomes emphasized.

The reason why the earpiece telephones pick up ambient noise more easily is because a voice to be picked up at an ear is approximately 80 dB Sound Pressure Level (hereinafter, SPL), which is approximately 14 dB SPL lower than the level of voice to be picked up by a telephone handset placed conventionally near the mouth. As a result, the voice must be amplified by 14 dB, but the ambient noise becomes amplified as well. Therefore, in order to send out the same level of voice signals as those signals usually picked up at a telephone handset, the voice, as well as ambient noise, is amplified by 14 dB SPL more.

When the earpiece telephones are used outdoors, a variety of ambient noises occur such as noise in a car on an expressway at high speed, noise in a train or at a train terminal, noise at a construction site and noise in a shop. Outdoor noises reach the level of 60 to 80 dB SPL which much higher than usual noise levels experienced indoor, which are normally less than 60 dB SPL. Since the voice level to be picked up at the ear is approximately 80 dB SPL, the voice-to-ambient-noise ratio becomes small.

When the voice-to-ambient-noise ratio becomes small, three practical problems in voice communication arise as a result.

First, a person under high ambient noise tends to raise his voice so as to be able to recognize his own voice. Outdoor ambient noises, however, have amplitude and frequency characteristics that change over time quite differently from the human voice. Therefore, it is feasible to distinguish the voice of the speaker under these outdoor noises. However, it is a difficult process.

Second, as soon as a speaker under high ambient noise stops talking, a listener on the quiet side becomes quite aware of high ambient noise coming through the telephone line. When the person on the quiet side starts talking while hearing high ambient noise from the other side through the telephone line, he finds his own voice difficult to recognize.

Lastly, when a person uses the earpiece telephone in a reverberating room or acoustic environment, the other side hears echoes as well. As a result, intelligibility of conversation is lowered.

SUMMARY OF INVENTION

The object of the present invention is therefore to provide an ambient noise suppression circuit that will provide high-quality voice communication when a caller is under high ambient noise in general and when the caller uses a voice communication device which has a significant distance between the microphone and the mouth in particular.

The above-mentioned object is attained in an ambient noise suppression electrical circuit for use in a voice communication terminal comprising a microphone, a gain control amplifier receiving a signal from the microphone, and a peak-hold circuit that comprises:

(i) a band-pass amplifier that amplifies a specified frequency range of the audio output signals of the microphone, (ii) a peak detection circuit that produces signals related to the peak level of the output signals of the band-pass amplifier, and (iii) a holding circuit that controls reduction of output signals of the peak detection circuit for a specified period of time and produces a peak-hold output signal. The gain control amplifier has a gain controlled by the peak-hold output signal.

Furthermore the present invention provides that the frequency range of the band-pass amplifier is defined as a frequency range beyond which the amplitude of signals is reduced by more than 3 dB compared with the level of a signal at the center frequency of the frequency range and such frequency range extends from 0.2 KHz to 2.0 KHz or from 0.2 KHz to 1.0 KHz. Further, the peak detection circuit is a bidirectional peak detection circuit detecting both the positive and the negative peak signals. The holding time of the peak-hold circuit, defined as the interval of time in which the signal level declines by 30% from its peak level, is within the range of 5 to 65 msec. for a unidirectional peak detection circuit detecting only the positive or the negative peak signal and within the ranges of 2.5 to 32.5 msec. for the bidirectional peak detection circuit. Additionally, the band-pass amplifier has a gain control switch that enables lowering of the gain of the band-pass amplifier under high ambient noise.

In operation, only the specified frequency range of the output signals of the microphone is amplified by the band-pass amplifier. Then, after the peak value of those output signals is detected by the peak detection circuit, the holding circuit maintains that peak signal output level against decline for a specified holding time. The gain control amplifier is then controlled by the output signal from the peak-hold circuit.

BRIEF DESCRIPTION OF DRAWINGS

These and other objects, advantages, features and uses of the invention will become apparent from the following description, when considered with the accompanying drawings in which.

DETAILED DESCRIPTION OF THE EMBODIMENTS

In order to illustrate how ambient noise in telephone conversation affects the quality of voice communication, each step of the conversation process is analyzed in relation to ambient noise in the following manner.

When a person (herein called "Q Person" meaning a person in a quiet environment) is in two-way voice communication with another person (herein called "N Person" meaning a person in a high noise environment) using a telephone or wireless phone and when N Person is exposed to high ambient noise, Q Person is not bothered so much by the ambient noise of N Person while N Person is talking. This is because N Person's voice overrides the background noise. Q Person, moreover, pays close attention to what N Person says and becomes less attentive to the ambient noise.

When N Person stops talking, however, Q Person suddenly becomes conscious of N Person's ambient noise. So, when Q Person starts talking, Q Person must raise his voice. This is because Q Person can not hear his own voice very well due to N Person's ambient noise. Hearing N Person's ambient noise is quite bothersome for Q Person.

During normal conversation on a telephone, people speak alternately (people seldom speak at the same time). Each person spends more than half to two thirds of the entire conversation time in silence. Therefore, if ambient noise is loud and clear on the telephone line, the period of silence becomes dominated by ambient noise. This period of silence, which is dominated by ambient noise, forms a significant portion of the conversation time. Therefore, if it were feasible during the period of silence to detect such ambient noise and then to reduce the level of ambient noise to be transmitted through the telephone line during that same period, the overall signal, which is human voice, to noise, which is ambient noise, ratio of the telephone conversation will improve significantly.

In order to realize the above-mentioned improvement, an electrical circuit controlling the level of signal to be transmitted through the telephone has to achieve the five technical merits listed below:

(1) it must be sure and consistent to distinguish between the speaking time (a period of time in which the microphone is detecting voice) and the non-speaking time (a period of time in which the microphone detects only ambient noise with no voice);

(2) it must amplify voice high during the speaking time and ambient noise low during the non-speaking time;

(3) it must smoothly shift to a high gain or to a low gain when changing gain during the transition between speaking time and non-speaking time;

(4) it must amplify voice only right from its start to its end at a constant level of gain during speaking time; and (5) in anticipation of outdoor usage, ambient noise both at high and low levels will be assumed. Therefore, it must be effective in suppressing the full range of ambient noise levels (a wide dynamic range).

Figure 1:
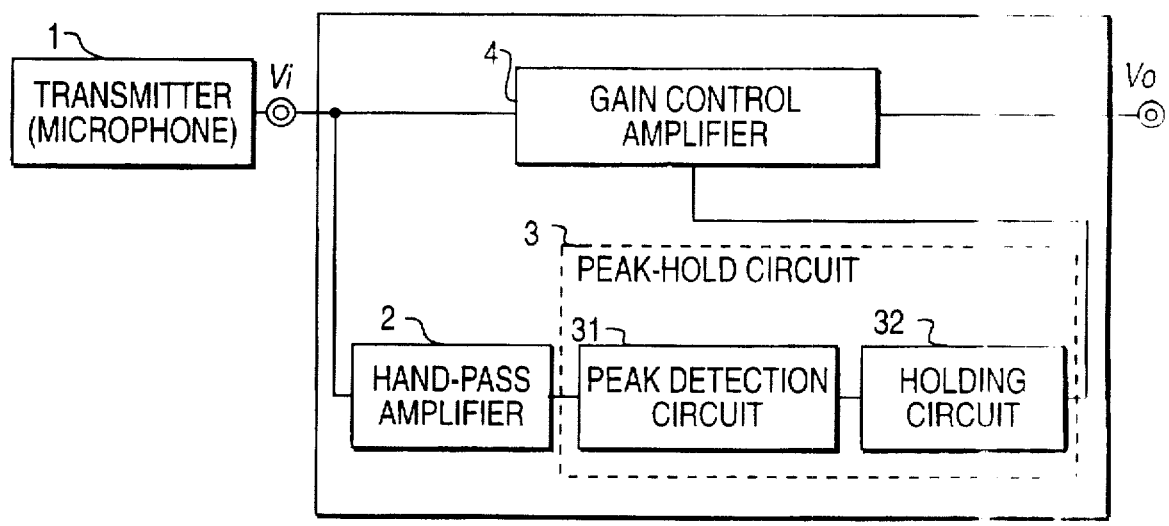
FIG. 1 is a block circuit schematic showing the embodiment of the present invention.

The object of the present invention as proposed in FIG. 1 is to realize the above technical merits.

Explanation will be given with reference to FIG. 1 which illustrates a block diagram embodiment of the present invention. A transmitter (microphone) 1 provides an electronic audio signal derived from the caller's voice into a band-pass amplifier 2 and into a gain control amplifier 4. Band-pass amplifier 2 amplifies voice signals in the specific frequency ranges from 0.2 KHz to 1 KHz or from 0.2 KHz to 2 KHz. The output of band-pass amplifier 2 is fed into peak-hold circuit 3. Peak-hold circuit 3 is comprised of two circuits, peak detection circuit 31 and holding circuit 32. After receiving the output of band-pass amplifier 2, peak detection circuit 31 produces signals in proportion to the peak levels of the output of band-pass amplifier 2. Holding circuit 32 delays decline of the output signal produced by peak detection circuit 31 for a specified period of time. Gain control amplifier 4 amplifies the voice signals of transmitter 1. The degree of amplification is controlled by the output signal of holding circuit 32.

Figure 2:
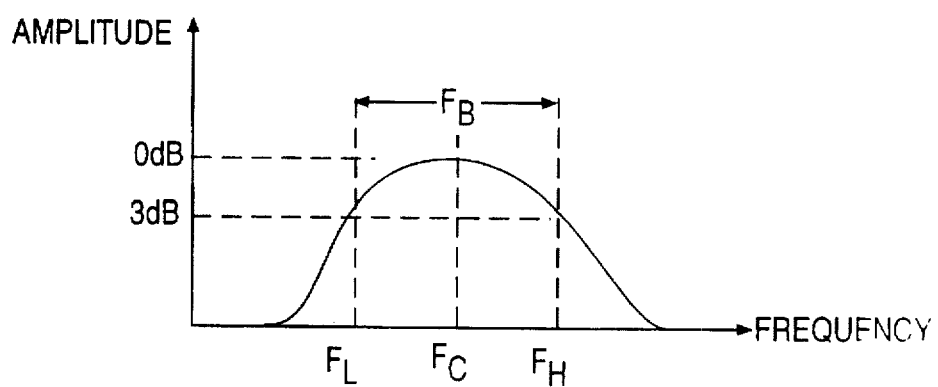
FIG. 2 is a graph showing the frequency characteristics of the band-pass amplifier.
Figure 3A:
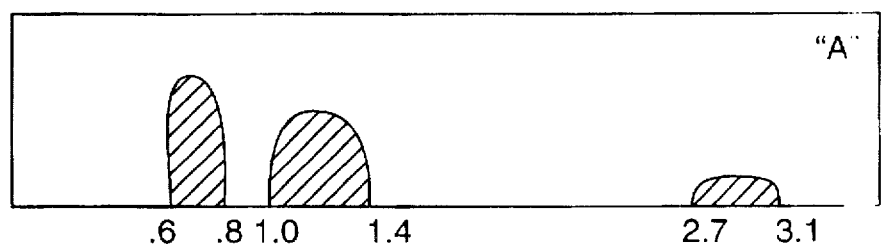
FIG. 3 is a graph showing the frequency characteristics of the first, second and third formants of Japanese vowels.
Figure 3B:
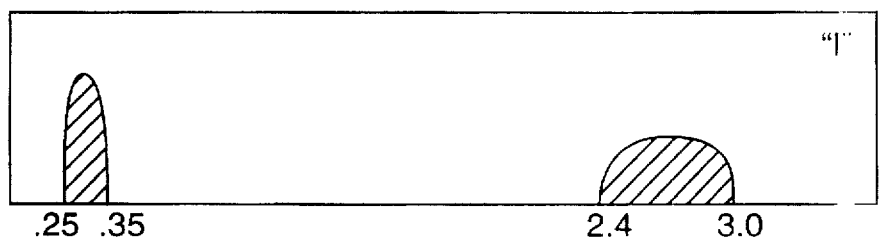
Figure 3C:
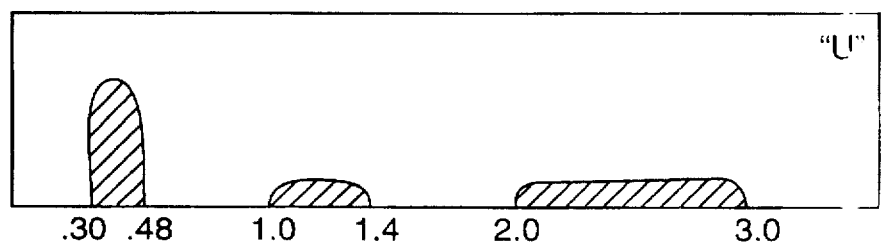
Figure 3D:
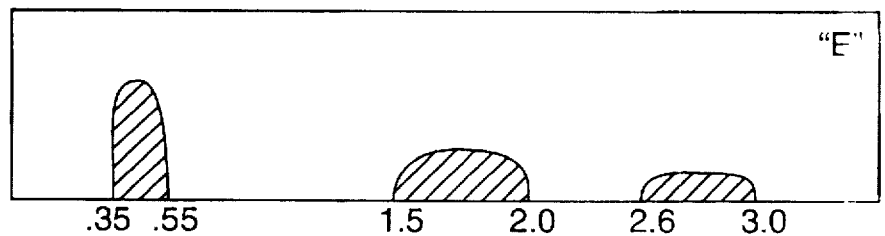
Figure 3E:
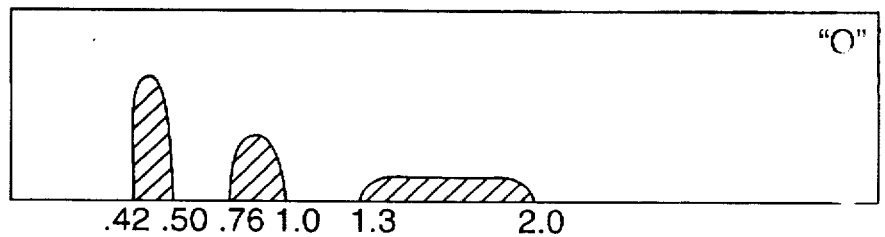

Technical merit (1) mentioned above, that the ambient noise suppression circuit should be sure and consistent to distinguish between the speaking time and the non-speaking time, is addressed first. Band-pass amplifier 2 is designed to fit the characteristic frequency domain of spoken conversation. FIG. 2 describes the selective characteristic frequency range from 0.2 to 1 KHz or from 0.2 to 2 KHz of speech.

The reason for this specific frequency range is that human conversation consists of voice, within which nearly all the time and energy of that voice is occupied by vowels. Vowels (in, for example, the Japanese language) are compound sounds of specific spectrum called first, second and third formants as shown in FIG. 3. The first and second possess nearly all of the energy of the vowel formant spectrum.

The first formant is distributed from almost 0.2 KHz to nearly 1 KHz while the second formant ranges from nearly 0.75 KHz to just over 2 KHz.

Consequently, when band-pass amplifier 2 has a frequency band width from 0.2 KHz to 2.0 KHz, the first and second formants fall in that frequency range, thus making the circuit very responsive to voice. When band-pass amplifier 2 has a frequency band width from 0.2 KHz to 1.0 KHz, only the first format falls in that frequency range, thus making the circuit responsive to voice.

Ambient noise is largely comprised of low frequency components (50 to 150 Hz), such as the rotational sounds caused by cars or trains, and high frequency components (greater than 2 KHz), such as friction noise. Thus, if the frequency range of band-pass amplifier 2 is designed to be from 0.2 KHz to 2 KHz or from 0.2 KHz to 1 KHz for the purpose of selecting only voice, the circuit becomes less responsive to such ambient noise. Consequently, technical merit (1) is achieved.

Technical merit (2) mentioned above, that the circuit should amplify voice high during the speaking time and ambient noise low during the non-speaking time, will be addressed next.

Figure 4:
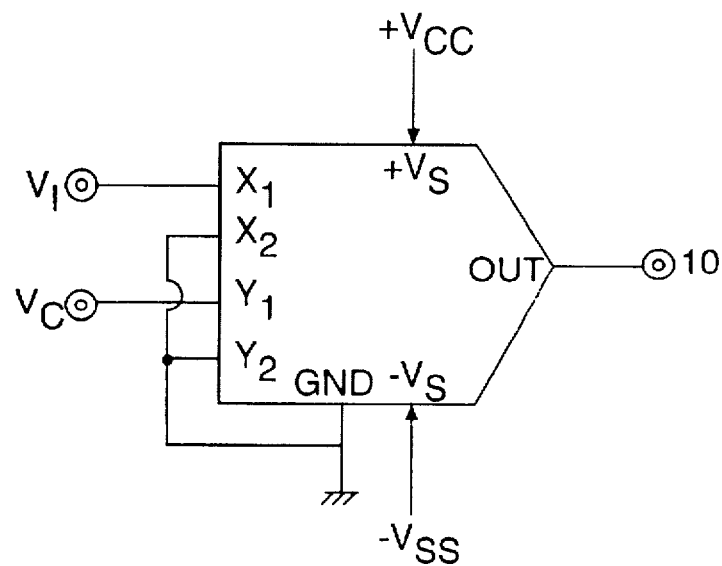
FIG. 4 is a schematic of the gain control amplifier based on an analog multiplier circuit.

In order to achieve technical merit (2) and, also, in order to realize an amplifier whose gain can be adjusted smoothly between the speaking time and non-speaking time (technical merit (3)), gain control amplifier 4 should be controlled by the level of the output of the peak-hold circuit 3, which relates to the peak level of the output of the band-pass amplifier 2. An analog multiplier circuit matches this need of the gain control amplifier 4. In accordance with the analog multiplier circuit shown in FIG. 4, the gain formula is as follows:

$$V_O = K \cdot (X_1 - X_2) \cdot (Y_1 - Y_2) = K \cdot V_I \cdot V_C$$

wherein, $V_1$ is the audio output of the transmitter 1, $V_C$ is the gain control signal coming from the peak-hold circuit 3, $V_O$ is the output of the gain control amplifier and K is a proportional constant.

Therefore, the gain G of the gain control amplifier 4 is described as follows:

$$G = K \cdot V_C$$

Figure 7:
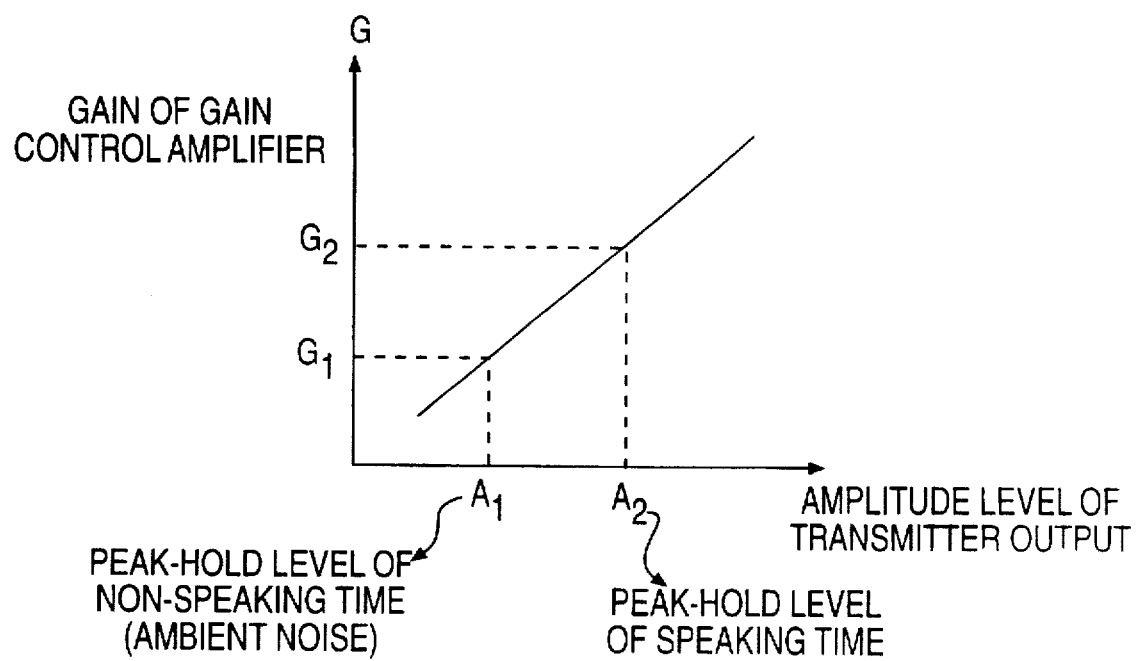
FIG. 7 is a graph showing the characteristic gain of the gain control amplifier of FIG. 4 as compared to the peak amplitude of the transmitter output.
Figure 8:
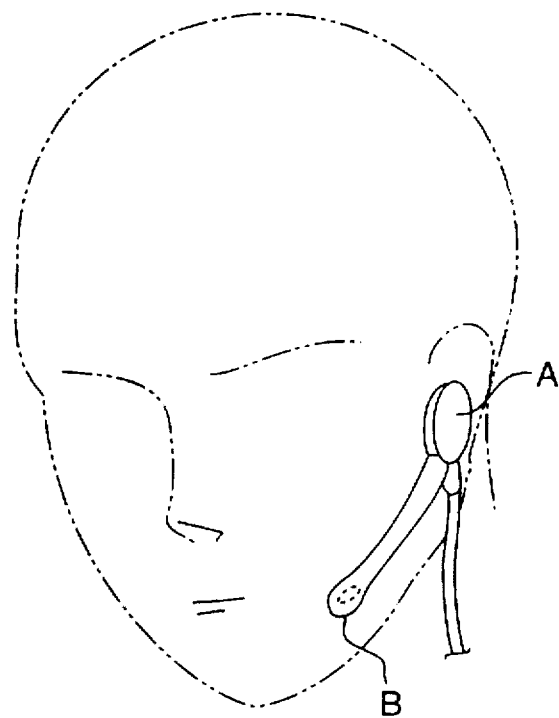
FIG. 8 is a perspective drawing showing one embodiment of existing hands-free telephone terminal equipment.
Figure 9:
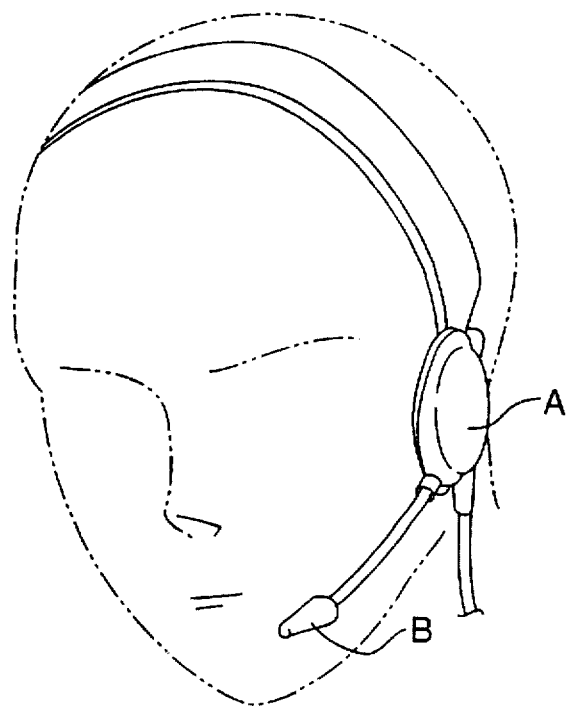
FIG. 9 is a perspective drawing showing a second embodiment of existing hands-free telephone terminal equipment.
Figure 10:
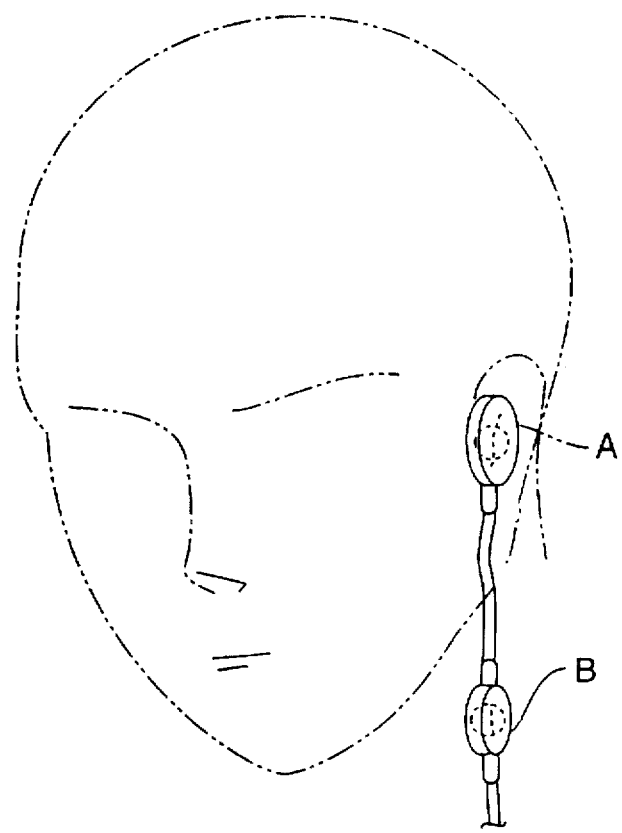
FIG. 10 is a perspective drawing showing a third embodiment of existing hands-free telephone terminal equipment.
Figure 11:
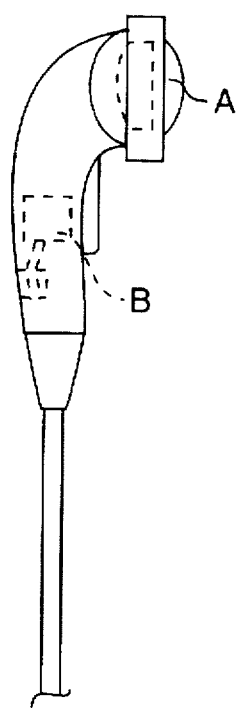
FIG. 11 is a drawing showing a fourth embodiment of existing hands-free telephone terminal equipment.
Figure 12:
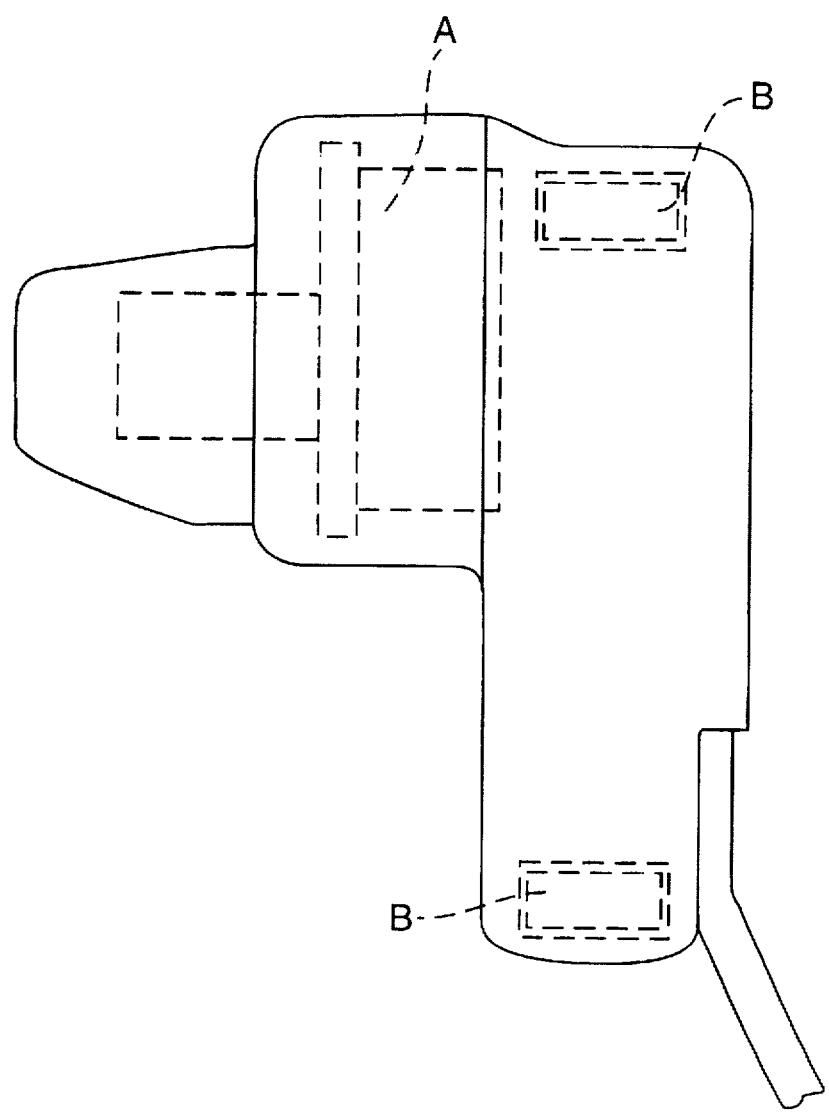
FIG. 12 is a drawing showing a fifth embodiment of existing hands-free telephone terminal equipment.

Accordingly, because the peak-hold value equals the amplitude of the audio output $V_C$ of the band-pass amplifier, the relationship of gain control signal G to the amplitude of $V_C$ is a proportional relation as shown in FIG. 7. As a result, the technical merit (2) is realized by using the analog multiplier. It is noted, however, that the relationship does not have to be a proportional relationship, but could be a logarithmic or quadratic direct relationship, for example.

Furthermore, the FET (field effect transistor) multiplier circuit (which utilizes changes in FET channel resistance), as well as other types of multiplier circuits, may also be used in place of the aforesaid analog multiplier circuit.

In order to determine a smooth switching between the speaking time and non-speaking time as defined in technical merit (3) and a correct holding time for the speaking time as defined in technical merit (4), operation of the holding circuit 32 is analyzed next.

Careful consideration must be paid to the peak holding time for the speech, in particular to the holding time for vowels since they occupy nearly all of a speaking voice. As the lower limit of the first formant of vowels is approximately 200 Hz, the longest cycle time $T_m$ of those vowels is approximately 5 msec.

Thus, the holding time $T_h$ for the peak-hold circuit 3 is designed in such a way that the peak value of a voice signal with a cycle time of 5 msec. can be held at least for a fixed period of time equivalent to the cycle time of the first format of vowels.

Figure 5:
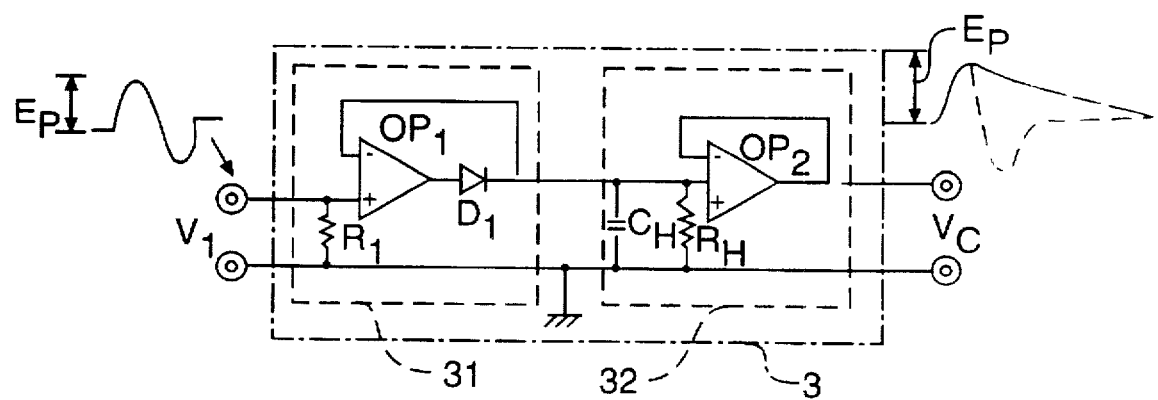
FIG. 5 is a circuit schematic showing a specific example of the unidirectional peak-hold circuit of FIG. 1.
Figure 6:
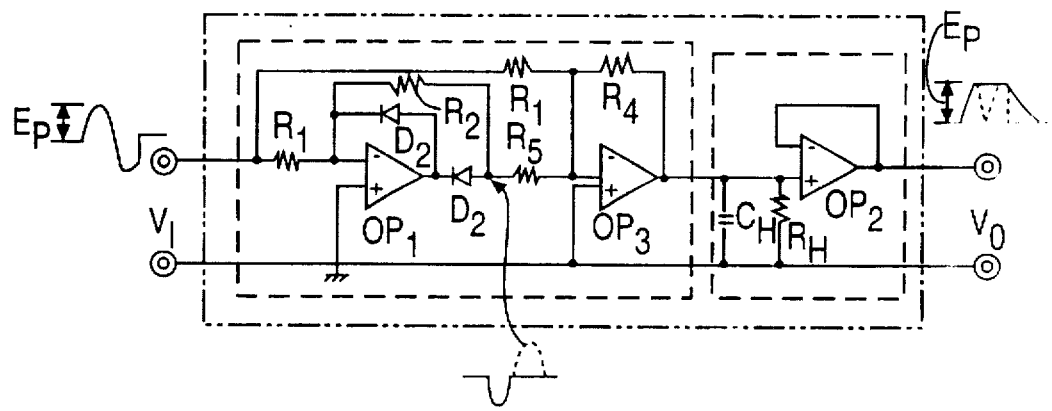
FIG. 6 is a circuit schematic showing a specific example of the bidirectional peak-hold circuit of FIG. 1.

FIG. 5 and 6 both show two examples of peak-hold circuit 3. FIG. 5 is a unidirectional peak detection circuit 31 consisting of operational amplifier $OP_1$, resistor $R_1$ and diode $D_1$, and a holding circuit 32 consisting of an operational amplifier $OP_2$, capacitor $C_H$ and resistor $R_H$. A holding time constant ($\tau$) is determined by the following formula:

$$\tau = R_H C_H$$

The holding circuit 32 has a holding time constant ($\tau$) determined by the above formula. Assuming the audio output $V_I$ of the band-pass amplifier has an amplitude of $E_p$, the output $V_O$ of the holding circuit 32 is determined by the following formula:

$$V_O = E_p \cdot exp(-t/\tau)$$

wherein t stands for time.

The rise time $T_r$ of the peak-hold circuit 3 is determined by the following formula:

$$T_r = (R_{OP} + R_D) \cdot C_H$$
$$= R_g \cdot C_H$$

wherein $R_{OP}$ is the output impedance of the operational amplifier $OP_1$, $R_D$ is the forward impedance of diode $D_1$ and $C_H$ is the capacitance of capacitor $C_H$.

Since it is customary to have $R_g$ far less than $R_H$, the rise time for peak-hold circuit 3 can be set as short as less than 2 msec., which is very short in comparison to the holding time.

FIG. 6 shows a bidirectional peak detection circuit 31. Major components include an operational amplifier $OP_1$ and diodes $D_1$ and $D_2$ and resistors from $R_1$ to $R_5$. The relative values among those resistors are as follows:

$$R_1 = R_2 = R_3 = R_4 = R$$

and $$R_5 = R/2$$

Holding circuit 32 in FIG. 6 consists of operational amplifier $OP_2$, capacitor $C_H$ and resistor $R_H$ which is identical to the holding circuit 32 of FIG. 5 mentioned above.

First of all, FIG. 5 is an example of the peak-hold circuit 3 that detects and holds a peak level of incoming audio signal by using unidirectional peak detection circuit 31 and the holding circuit 32. FIG. 6 is an example of the peak-hold circuit 3 that detects and holds a peak level of incoming audio signal by using bidirectional peak detection circuit 31 and holding circuit 32. It is to be noted that holding circuit 32 is common in FIG. 5 and FIG. 6.

The output $V_O$ of the holding circuit 32 changes in relation to time as shown by the following formula:

$$V_O = E_p \cdot exp(-t/\tau)$$

In this connection, we define $T_1$ and $T_2$ for further analysis.

$T_1$ is defined as the period of time during which an input signal declines from its peak signal level to 70% of that peak signal level. $T_2$ is defined as the period time during which an input signal declines from its peak signal level to 1% of that peak signal level. Since the peak-hold level equals $E_p \cdot exp(-t/\tau)$, the relationship of $T_1$ to $T_2$ can be described as follows:

$$T_1 = [-ln((100-30)/100)] \cdot \tau = 0.36\tau$$

$$T_2 = [-ln((100-99)/100)] \cdot \tau = 4.6\tau \simeq 13T_1$$

Because the gain of the gain control amplifier 4 is proportionate to the output of the holding circuit 32, $T_1$ represents the period of time during which the gain of the gain control amplifier 4 has declined to 70% of the peak signal level (declined by −3 dB). $T_2$ represents likewise the period of time during which the gain has declined to 1% of the peak signal level (declined by −40 dB). Because a period hardly notices a gain decline of less than 30%, $T_1$ is considered to be the shortest holding time.

On the other hand, $T_2$ is considered to be the longest holding time, since the peak signal level declines to 1% during the period of $T_2$ at which point the signal becomes insignificant to the ear. Accordingly, an optimum holding time $T_h$ is decided from the range of time period listed below:

$$T_1 \leq T_h \leq T_2 = 13T_1$$

Because spoken words, as mentioned before, are mostly a collection of vowel sounds and because the longest cycle time $T_m$ of vowels is approximately 5 msec., the shortest holding time $T_1$ can be the longest cycle time of vowels. Accordingly, $T_1$ is set as follows:

$$T_1 = T_m$$

The optimum holding time $T_h$ for a unidirectional peak detection circuit 31 can then be determined as follows:

$$T_m \leq T_h \leq 13T_m, \text{ or specifically } (5 \text{ msec.} \leq T_h \leq 65 \text{ msec.})$$

Considering that the bidirectional peak detection cycle is one half of the unidirectional peak detection cycle, then the optimum holding time $T_h$ for a bidirectional peak detection circuit 31 can be determined as follows:

$$0.5T_m \leq T_h \leq 6.5T_m (2.5 \text{ msec.} \leq T_h \leq 32.5 \text{ msec.})$$

If the holding time $T_h$ is selected as 15 msec., for example in the case of the bidirectional peak detection circuit 31, the gain of the gain control amplifier 4 will be held constant for 15 msec. at each level of voice as shown in FIG. 7. As a result, the voice will not fluctuate in volume while spoken. In addition, the rising time $T_r$ of the peak-hold circuit 3 is so fast (as fast as less than 2 msec.) that the start of a voice immediately increases the gain of the gain control amplifier 4.

As a result, technical merit (4), that the ambient noise suppression circuit should amplify voice only right from its start to its end at a constant level of gain during speaking time, is achieved.

In order to explore the longest holding time which is practical for voice application, $Tf$ is defined as a period of time after which gain of the gain control amplifier 4 declines to a level of 1% of the immediately previous peak gain level. Since the output of the holding circuit 32 decreases logarithmically, $T_f$ equals 13 times $T_1$.

Since $T_h$ can be set at a period of time selected from the range of 2.5 msec. to 32.5 msec. in the case of the bidirectional peak detection circuit 31, $T_f$, in accordance with the above mentioned formulas, can be selected from the range of 32.5 msec. to 422.5 msec. As a result, $T_f$ is far less than 1 sec., which is hardly noticeable to the human ear. For example, if $T_f$ is set at 50 msec., the gain control amplifier 4 quickly reduces gain as soon as speaking stops, resulting in the fast suppression of ambient noise.

When the holding time of peak detection circuit 31 is defined as the time in which the gain declines by 30% from its peak value, then the holding time for the unidirectional peak detection circuit 31 can be set at a period of time selected from the range of 5 msec. to 65 msec. and for the bidirectional peak detection circuit 31 2.5 msec. to 32.5 msec. respectively. In this case, unnatural interruption of voice due to too short a holding time is avoided. Likewise, when the long holding time is not too long, the noise suppression works properly. As such, technical merit (3), that the ambient noise suppression circuit should smoothly shift to a low gain when changing gain in the transition between the speaking time and the non-speaking time, is accomplished.

In other words, the lowest frequency of the first vowel formants, which also account for the largest portion of transmitted voice energy, is 200 Hz. By designing the holding time to be selected from the range of 1 to 13 times the 5 msec. time cycle of the lowest frequency, the gain of the gain control amplifier 4 is able to be quickly forced down low at the end of speaking time without damaging the smoothness and continuity of the conversation. In this way, optimal gain control of voice can be implemented. In addition, a bidirectional peak detection circuit 31 performs peak detection within only one half of a full wave cycle, while a unidirectional peak detection circuit 31 requires the full wave cycle. Therefore, the optimal holding time for a bidirectional peak detection circuit 31 is one half of the optimal holding time for the unidirectional peak detection circuit 31.

Next, the mechanism of how the proposed circuits suppress ambient noise will be discussed. In this analysis, voice is regarded as signal and ambient noise is regarded as noise. The ratio of the signal to the noise (herein called "SN ratio") is calculated as follows:

Referring to peak-hold circuit 3, the peak-hold level is a peak signal level within a fixed holding time period. This peak-hold level is approximately proportional to the effective value $V_{1rms}$ of voice at the input of transmitter 1 when averaged over time. In short, the peak-hold level can be considered to be equal to the amplitude in proportion to the effective value. Therefore, the following formulas exist:

$$V_{C2} = A_2 = k \cdot V_{f2rms} \quad (1)$$

$$V_{C1} = A_1 = k \cdot V_{f1rms} \quad (2)$$

where in $V_{f2rms}$ is the effective value of the voice within the speaking time, $V_{f1rms}$ is the effective value of the ambient noise within the non-speaking time, and k is a constant (for example, a sign wave has constant $1 \simeq 1.4$) proportional to the relationship between the amplitude and the effective value.

The gain of the gain control amplifier 4 is proportional to the amplitude as mentioned before. Therefore:

$$V_O = K \cdot V_I \cdot V_C$$

The ratio of voice and ambient noise between the speaking time and the non-speaking time is calculated as follows:

$$V_{O2rms}/V_{O1rms} = (K \cdot V_{I2rms} \cdot k \cdot v_{I2rms})/(K \cdot v_{I2rms} \cdot k \cdot v_{I1rms}) \quad (3)$$

$$= (V_{I2rms}/V_{I1rms})^2$$

In the above formula, $V_{O2rms}/V_{O1rms}$ is the output ratio at the output of the gain control amplifier 4. $V_{I2rms}/V_{I1rms}$ is the ratio at the input of transmitter 1 (or microphone). As a result, the two signal-to-noise ratios, at both the input of transmitter 1 and the output of gain amplifier 4, have the following relationship:

$$(S/N)_O = (S/N)_I^2$$

In other words, the output signal-to-noise ratio can be improved over the input signal-to-noise ratio by a squared factor.

For example, using the squared relation above, if the input SN ratio is 3 times, then the output SN ration is improved to 9 times, and if the input SN ratio is 5 times, then the output SN ratio is improved to 25 times. However, when $(S/N)_I < 1$, then output SN ratio, conversely, worsens. Ambient noise is smaller than the voice under ordinary conditions. Therefore, the abovementioned squared-factor relationship provides sufficient general ambient noise reduction. Under a high noise environment where ambient noise is close to 80 dB SPL, a loud voice must be used to perform a call. As a result, a sufficient SN ratio can be maintained. When ambient noise exceeds 90 dB SPL, however, that ambient noise becomes uncomfortable and unendurable to the ear. Thus, a SN input signal ratio of $(S/N)_I < 2$ is rare under ordinary usage.

Two types of peak detection circuits, a unidirectional peak detection circuit 31 and a bidirectional peak detection circuit 31, are shown in FIG. 5 and 6 respectively. The bidirectional peak detection circuit 31 has additional value over the unidirectional peak detection circuit 31. The bidirectional peak detection circuit 31 has a response time when detecting peaks that is twice as fast as that of the unidirectional peak detection circuit 31. (Because a voice audio signal may begin either negatively or positively with equal probability, a unidirectional peak detection circuit 31 has a 50% probability of not detecting one of the positive or negative signals). In addition, because the output cycle time of peak detection circuit 31 is half of that of unidirectional peak detection circuit 31, the transition time from the speaking time to the non-speaking time for the bidirectional peak detection circuit 31 is reduced by one half and thus also is twice as fast.

Furthermore, technical merit (5) can be realized by having a gain control switch at the band-pass amplifier 2. The function of the gain control switch is to cause the band-pass amplifier 2 to amplify signals less when ambient noise is high. When ambient noise is high, a person tends to raise his voice so that he will be able to listen to his own voice. Therefore, when the gain control switch responds, the lessened gain of the band-pass amplifier 2 will not harm voice communication. An additional benefit of the gain control switch is that it prevents overloading or saturation of gain control amplifier 4 and band-pass amplifier 2, thus resulting in the expansion of the dynamic range of the circuit. In other words, the circuit becomes versatile at suppressing a wide range of levels of ambient noises. Thus, technical merit (5) is achieved.

In summary, the ambient noise suppression circuit described herein works very effectively, particularly when transmitter 1 is located at some distance from the mouth. Note that this ambient noise suppression circuit is also effective in reducing noise when installed in ordinary telephone terminals. Providing additional merit, the circuit prevents feedback which occurs when a user covers an ear wearing a hands-free earpiece terminal with a hand. The feedback does not occur, however, because the gain of the gain control amplifier 4 is kept low unless a voice is present. Thus, feedback occurs hardly at all.

In the present invention, only a specific frequency range of the audio output of the transmitter 1 is amplified by the band-pass amplifier 2. The peak level of that audio output after the band-pass amplifier 2 is then detected by the peak detection circuit 31. The decline of the detected peak level is controlled for a fixed holding time by the holding circuit 32. And finally, the gain control amplifier 4 is controlled according to the output of the holding circuit 32. Under circumstances in which the ambient noise is large and even when the microphone is located distant from the mouth, the present invention is able to realize clear and reliable voice communication. Moreover, in places where an echo arises (for example, in an acoustically reverberant room), the echo is also able to be eliminated.

An optimum frequency range for the band-pass amplifier 2, which is defined as a range whose amplitude decline is within 3 dB against the level of its central frequency, is set from 0.2 KHz to 2 KHz or from 0.2 KHz to 1 KHz. As a result, the frequencies of the first and second vowel formants, which fall in that pass-band of band-pass amplifier 2 and possess nearly all of the energy in the human voice, are able to be selectively detected. Consequently, ambient noise outside of this frequency range is not able to activate gain control amplifier 4. Moreover, those voices of people nearby the caller are able to be suppressed by the circuit by means of the difference in signal level, because it can be assumed that voices of people nearby the caller are, generally, at a level lower than the caller's voice (due to the distance of separation).

In comparison to the unidirectional peak detection circuit 31, when a bidirectional peak detection circuit 31 is used as the peak detection circuit 31, the response characteristic is improved because the response rise time of the output of peak detection circuit 31 is reduced. Moreover, the transition time from the speaking time to the non-speaking time can also be reduced by one half.

The holding time for the aforesaid peak-hold circuit 3 is set at a period of time selected from the range of 5 msec. to 65 msec. with an unidirectional peak detection circuit 31 and from the range of 2.5 msec. to 32.5 msec. with a bidirectional peak detection circuit 31 respectively. With these holding times selected for the two types of the peak-hold circuit 3 respectively, voices in phone conversation will not be unnaturally interrupted. In addition, the effectiveness of the ambient noise suppression circuit will not decrease by the gain of the gain control amplifier 4 being unnecessarily high after a loud voice finishes and ambient noise alone remains.

The band-pass amplifier 2 can have a gain control switch that is used when ambient noise is extremely large. When a person is exposed to such large ambient noise, his voice will be raised naturally so as to be able to listen to his voice. This high sound level situation tends to overload the circuits. Therefore, the gain switch lowers the gain of the band-pass amplifier 2 so that the circuits will not be overloaded. As a result, the switch in fact expands the dynamic range of the ambient noise suppression circuit.

All of the circuitry described above can be implemented with digital circuitry, such as digital integrated circuits, as well as with analog circuitry. The digital circuitry may be advantageous for mobile telephony.

What is claimed is:

1. An ambient noise suppression circuit for a hands-free voice communication terminal comprising a microphone, means for positioning the microphone for hands-free operation, a gain control amplifier receiving a signal from the microphone, and a peak-hold circuit that comprises:

(i) a band-pass amplifier that amplifies a specified frequency range of audio output signals of said microphone, (ii) a peak detection circuit that produces signals related to the peak amplitude of output signals of the said band-pass amplifier, and (iii) a holding circuit that holds the amplitude of the produced signals of said peak detection circuit without significant reduction for a specified period of time and produces a peak-hold output signal; and wherein the peak-hold output signal is applied solely and directly to control gain of said gain control amplifier in direct relation to the peak-hold output signal.

2. The ambient noise suppression circuit as claimed in claim 1, wherein said band-pass amplifier has the specified frequency range as a frequency range of preferential amplification beyond which the amplitude of its output signals is reduced by more than 3 dB compared with the amplitude of a signal at the center frequency of said frequency range and said frequency range is from 0.2 KHz to 2.0 KHz.

3. The ambient noise suppression circuit as claimed in claim 1, wherein said band-pass amplifier has a frequency range defined as a frequency range beyond which the amplitude of its output signals is reduced by more than 3 dB compared with the amplitude of a signal at the center frequency of said frequency range and said frequency range is from 0.2 KHz to 1.0 KHz.

4. The ambient noise suppression circuit as claimed in claim 1, wherein said peak detection circuit is a bidirectional peak detection circuit detecting both the positive and the negative peak signals.

5. The ambient noise suppression circuit as claimed in claim 1, wherein said peak-hold circuit has a holding time, defined as the interval of time in which the peak-hold signal declines by 30% from its peak amplitude, within the range of 5 msec. to 65 msec. under the condition that said peak detection circuit comprises a unidirectional peak detection circuit detecting only the positive or the negative peak signal.

6. The ambient noise suppression circuit as claimed in claim 1, wherein said peak-hold circuit has a holding time, defined as the interval of time in which the peak-hold signal declines by 30% from its peak amplitude within the range of 2.5 msec. to 32.5 msec. under the condition that said peak detection circuit comprises a bidirectional peak detection circuit.

7. The ambient noise suppression circuit as claimed in claim 1, wherein said band-pass amplifier has a gain control switch that enables lowering of the gain of said band-pass amplifier during occurrence of high ambient noise.

* * * * *